(12) United States Patent
Gunyan et al.

(10) Patent No.: US 7,671,605 B2
(45) Date of Patent: Mar. 2, 2010

(54) LARGE SIGNAL SCATTERING FUNCTIONS FROM ORTHOGONAL PHASE MEASUREMENTS

(75) Inventors: Daniel B Gunyan, Santa Rosa, CA (US); David E Root, Santa Rosa, CA (US); Loren C Betts, Santa Rosa, CA (US); Jason M Horn, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 218 days.

(21) Appl. No.: 12/015,932

(22) Filed: Jan. 17, 2008

(65) Prior Publication Data

US 2009/0184722 A1 Jul. 23, 2009

(51) Int. Cl.
G01R 27/04 (2006.01)
(52) U.S. Cl. ............... 324/638; 324/76.22; 324/76.77; 324/612; 324/622
(58) Field of Classification Search ................ 324/638
See application file for complete search history.

(56) References Cited

U.S. PATENT DOCUMENTS

| | | | | |
|---|---|---|---|---|
| 3,711,769 | A * | 1/1973 | Peake | 324/612 |
| 4,777,429 | A * | 10/1988 | Potter | 324/638 |
| 5,751,153 | A * | 5/1998 | Bockelman | 324/638 |
| 6,861,846 | B2 * | 3/2005 | Anderson | 324/623 |
| 6,937,032 | B2 * | 8/2005 | Adamian | 324/683 |
| 6,998,833 | B2 * | 2/2006 | Wang et al. | 324/76.12 |
| 7,038,468 | B2 | 5/2006 | Verspecht | |
| 7,486,067 | B2 * | 2/2009 | Bossche | 324/76.22 |
| 7,518,353 | B2 * | 4/2009 | Tanbakuchi et al. | 324/76.77 |
| 7,592,818 | B2 * | 9/2009 | Mori et al. | 324/638 |
| 2002/0196033 | A1 * | 12/2002 | Martens | 324/612 |
| 2004/0113632 | A1 * | 6/2004 | Anderson | 324/622 |
| 2004/0257092 | A1 * | 12/2004 | Verspecht | 324/638 |
| 2006/0161409 | A1 * | 7/2006 | Root et al. | 703/13 |
| 2007/0194776 | A1 * | 8/2007 | Bossche | 324/76.22 |

OTHER PUBLICATIONS

Root et al, U.S. Appl. No. 11/035,651, filed Jan. 14, 2005.
D. E. Root, J. Verspecht, D. Sharrit, J. Wood, and A. Cognata, "Broad-Band, Poly-Harmonic Distortion (PHD) Behavioral Models from Fast Automated Simulations and Large-Signal Vectorial Network Measurements,"IEEE Transactions on Microwave Theory and Techniques, vol. 53, No. 11, Nov. 2005, pp. 3656-3664.
J. Verspecht, D. E. Root, J. Wood, A. Cognata, "Broad-Band Multi-Harmonic Frequency Domain Behavioral Models from Automated Large-Signal Vectorial Network Measurements,"2005 IEEE MTT-S Int. Microwave Symp. Dig., Long Beach, CA, USA, Jun. 2005.
J. Verspecht and D. E. Root, "Poly-Harmonic Distortion Modeling", in IEEE Microwave Theory and Techniques Microwave Magazine, Jun. 2006.

(Continued)

*Primary Examiner*—Timothy J Dole
*Assistant Examiner*—Benjamin M Baldridge

(57) ABSTRACT

The invention measures the X-parameters (or large-signal S and T scattering functions, sometimes called linearized scattering functions, which are the correct way to define "large-signal S-parameters") with only two distinct phases for small-signals on a frequency grid established by intermodulation frequencies and harmonics of the large-tones, with guaranteed well-conditioned data from which the X-parameter functions can be solved explicitly, without the need for regression, and not limited by performance limits of the reference generator or phase-noise.

12 Claims, 4 Drawing Sheets

OTHER PUBLICATIONS

J. Verspecht, D. Gunyan, J. Horn, J. Xu, A Cognata, and D. E. Root, "Multi-tone, Multi-port, and Dynamic Memory Enhancements to PHD Nonlinear Behavioral Models from Large-signal Measurements and Simulations", in 2007 IEEE MTT-S Int. Microwave Symp. Dig., Hawai, Jun. 2007, pp. 969-972.

Soury, A., Ngoya, E., Rousset, J., "Behavioral Modeling Of RF And Microwave Circuit Blocks For Hierarchical Simulation Of Modern Transceivers", 2005 IEEE MTT-S Int. Microwave Symp. Dig. Jun. 2005.

* cited by examiner

LARGE SIGNAL SCATTERING FUNCTIONS FROM ORTHOGONAL PHASE MEASUREMENTS

BACKGROUND

Linear electronic systems are completely characterized by S-parameters. S-parameters are sufficient to predict, based on the superposition principle, the complete response of a linear system to an arbitrary set of stimuli over the frequency range for which the S-parameter data exists. S-parameters characterize the linear relationship b=S*a, where a is the vector the incident waves and b the vector of reflected and transmitted waves. S is the matrix defining the linear relationship between incident and reflected/transmitted waves.

S-parameters are useful for nonlinear systems, but under limited conditions, e.g. a transistor, biased at a fixed set of voltages at the input and output port. If a small RF signal is incident at port 1, linear S-parameter theory and measurement techniques can provide a good approximation to the scattered and reflected waves produced by the transistor. However, S-parameters must be measured for very small signal levels, to make sure the device response is approximately the linear response around the fixed (static) operating point determined by the bias conditions. If the signals used for S-parameter measurements are too large, harmonics are generated by the device that are unaccounted for by S-parameter theory. Beyond the linear response of nonlinear devices at fixed (static) biases, it is often desirable to measure the linear response of nonlinear devices while they are simultaneously stimulated by one or more large signal excitations, such as a large sinusoidal signal at the input, or a multi-carrier communication signal incident on the amplifier. This is the case for power amplifiers when they are actually amplifying a signal. In this case, rigorous mathematical and physical considerations require the linear response of such a system to be given by their X-parameter description:

$$B_{pk} = X_{pk}^{(F)}(|A_{11}|)P^k + X_{pk,ql}^{(S)}(|A_{11}|)P^{k-l} \cdot A_{ql} + X_{pk,ql}^{(T)}(|A_{11}|)P^{k+l} \cdot A_{ql}^*$$

Equation 1

Or, equivalently, $$B_{pk} = F_{pk}(|A_{11}|)P^k + S_{pk,ql}(|A_{11}|)P^{k-l} \cdot A_{ql} + T_{pk,ql}(|A_{11}|)P^{k+l} \cdot A_{ql}^*$$

Equation 2

Equation 1 shows the contribution to the scattered and transmitted B-waves at port p and harmonic index k given a single large input tone at frequency f, amplitude $A_{11}$, and an additional small tone at port q and harmonic index, l corresponding to a frequency of l*f. The objective of the invention is to extract the F, S, and T nonlinear functions for all combinations of port and frequency indices.

Here the nonlinear scattering functions, S and T, depend nonlinearly on the large signals (in this notation a single large input tone, A, incident at port 1), while the dependence on small additional incident waves, a (a vector with components for ports and harmonics or intermods), is linear in both a and conj(a), independently. P=exp(j*phase*t) where phase is the phase of the large-signal incident signal(s). The proper theory of "large-signal S-parameters" we now call X-parameters. The key fact is the requirement of terms linear in both a and conj(a), with different coefficients, the large-signal S-functions and large-signal T-functions, respectively. The present invention is a particularly effective method to implement the measurements at RF, Microwave, and mm-wave and to identify the resulting S and T functions, which are the correct large-signal generalization of linear s-parameters in the case of driven nonlinear systems.

Equation 1 generalizes to the case where there are many large tones. The S and T functions then depend on the amplitudes of each of the large tones (and also the relative phases if some tones are at the same frequency). But the principle of the measurement and identification of the S and T functions from added small tones with orthogonal phases applies directly. Of particular interest is when two large tones are applied at the input of an amplifier, creating energy at the intermodulation products, and for the case of a mixer, two tones at distinct ports (LO and RF) are applied and mixing terms observed at the IF. The invention discussed here applies directly.

One prior art method, e.g. random phase method, is using two standard microwave sources. One source produces a large-signal stimulus while the other source produces small perturbation tones at the fundamental frequency (and harmonics for the augmented model) to probe the linear response. The phase of the probe signal is not controlled, but several phases (multiple measurements) are required so that the (random) phases sample a wide enough range of angles that the X-parameters (S and T functions) can be obtained by regression. At each frequency, this results in an over-determined set of equations for B-waves given a and conj(a) waves at the random phases. These equations are solved by one of a few standard regression analyses. Unfortunately, more measurements than are actually necessary to solve Equation 1 for S and T are required. The regression requires a well-conditioned set of equations from the random measurements. To make sure the equations are well-conditioned, many different phases are required. This takes much more time (proportional to the number of phases). Given the random nature of the multiple measurements, there is always a chance that the resulting equations may still be poorly-conditioned if an unfavorable sample of phases happens to occur. There is a factor of 3 to 6 more measurements taken than optimally required using other methods.

In another prior art method, the offset-frequency-method, small extraction tones are applied simultaneously with the large stimulus signal, to the DUT at frequencies slightly offset from the fundamental of the large signal and also the harmonic or intermod frequencies of the large signal. This allows direct identification of the S and T functions (at each harmonic frequency), by measuring the B-waves at the upper and lower side-bands of the output harmonic spectra. This requires measurements at more frequencies than the present invention (three frequencies in the vicinity of each of the harmonics of interest—including the harmonic frequencies. Another drawback of the offset frequency method is that the magnitude of the frequency difference (offset) between the small a-tones and the large tones must be small for the method to return the S and T functions. This requires the phase reference—a key component of the measurement system—to put out energy at very closely-spaced tones. To get energy at closely spaced tones the phase reference must be pulsed at a low pulse repetition frequency since the tone spacing from the phase reference is directly related to the pulse repetition frequency. The amplitude of the phase reference tones are proportionally related to the duty cycle of the pulse signal. Since the pulse width remains constant and the pulse repetition rate is decreased, to get closely spaced tones the duty cycle decrease linearly with the pulse repetition frequency causing a reduction in the amplitude of the phase reference frequency tones. Since these tones are used to related the phases of the frequencies of interest, any decrease in signal to noise will cause additional measurement uncertainties. The second drawback is that as the offset frequency decreases, phase noise from the measurement system can limit the resolution of the measurements.

SUMMARY

The invention measures the large-signal S and T scattering functions (correct large-signal S-parameters) with only two distinct phases for small-signals on the same frequency grid as determined by intermodulation frequencies and harmonics of the large-tones, with guaranteed well-conditioned data from which the S and T functions can be solved explicitly, without the need for regression, and not limited by performance limits of the reference generator or phase-noise.

DETAILED DESCRIPTION

The invention measures the large-signal S and T scattering functions (correct large-signal S-parameters) with only two distinct phases for small-signals on the same frequency grid as harmonics and intermodulation frequencies of the large-tones, with guaranteed well-conditioned data from which the S and T functions can be solved explicitly, without the need for regression, and not limited by performance limits of the reference generator or phase-noise.

This invention measures the S and T functions (correct and complete Large-Signal Scattering Functions) by using many fewer experiments than required by the random phase method, and fewer independent frequency measurements than the offset frequency method. It requires (for a given large-signal stimulus) only two additional small-signal experiments (per port per frequency). This reduces the number of measurements, and therefore the measurement time, by a typical factor of 3 to 6 compared to random phase measurement. The invention is designed to produce data that is automatically well-conditioned. The S and T functions can be explicitly solved, without even the need for regression, speeding up the calculation. Regression can still be used if desired, by taking more than 2 phases (e.g. three phases separated by 120 degrees from one another). Because the phases are controlled rather than random, the resulting system of equations is guaranteed to be well-conditioned.

When contrasted to the prior art off-set frequency method, the invention is not limited by phase-reference hardware limitations at narrowly spaced tones, as compared to the prior art offset frequency method. The small tones need only be applied on the harmonic grid determined by the large tone (or at worst the set of intermodulation frequencies from two large tones). These frequencies are usually well-separated, making it very easy for the phase reference generator to put out sufficient energy on this grid. Additionally, the invention is not limited by phase-noise problems in the vicinity of the spectrum produced by the large tones.

Figure 1:
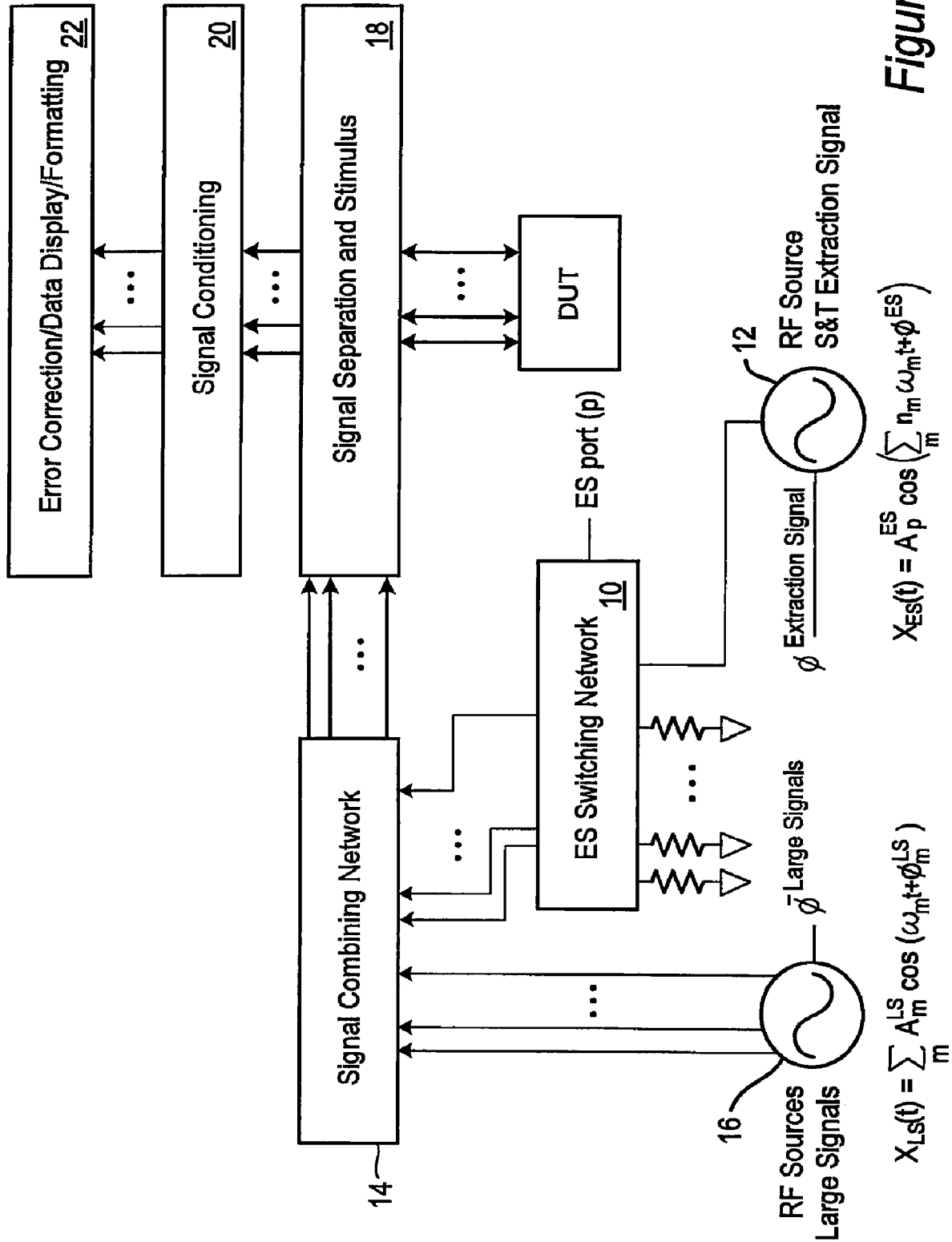
FIG. 1 illustrates a block diagram of a signal conditioning apparatus.

FIG. 1 illustrates a block diagram of a signal conditioning apparatus. An ES switching network 10 receives input form an extraction signal source 12. A signal combining network 14 receives as inputs the outputs of the ES switching network 12 and RF sources 16. The output of the switching network 10 are received by a signal separation and stimulus control 18. A device under test (DUT) bidirectionally connects to the signal separation and stimulus control 18. A signal conditioning circuit 20 receives the outputs of the signal separation and stimulus control 18. A display 22 receives the output of the digitization and signal conditioning circuit. The display may include error correction and formatting of the data.

In operation, one source is used as the input signal stimulus to the DUT and the other is used to extract the S and T parameters. The input signal stimulus may be a multi-tone source (not shown). The extraction signal stimulus is normally single tone and its frequency is set to be equal to a harmonic or an intermodulation product (if multi-tone) of the input signal stimulus. The extraction signal is applied twice at each of the desired frequencies: first at an initial phase then by setting the source to an orthogonal phase. These signals may be applied to any combination of the DUT's ports using the signal separation and stimulus control 14. The resulting measurements are then processed to extract the S and T parameters using methods mentioned in previous sections.

Figure 2:
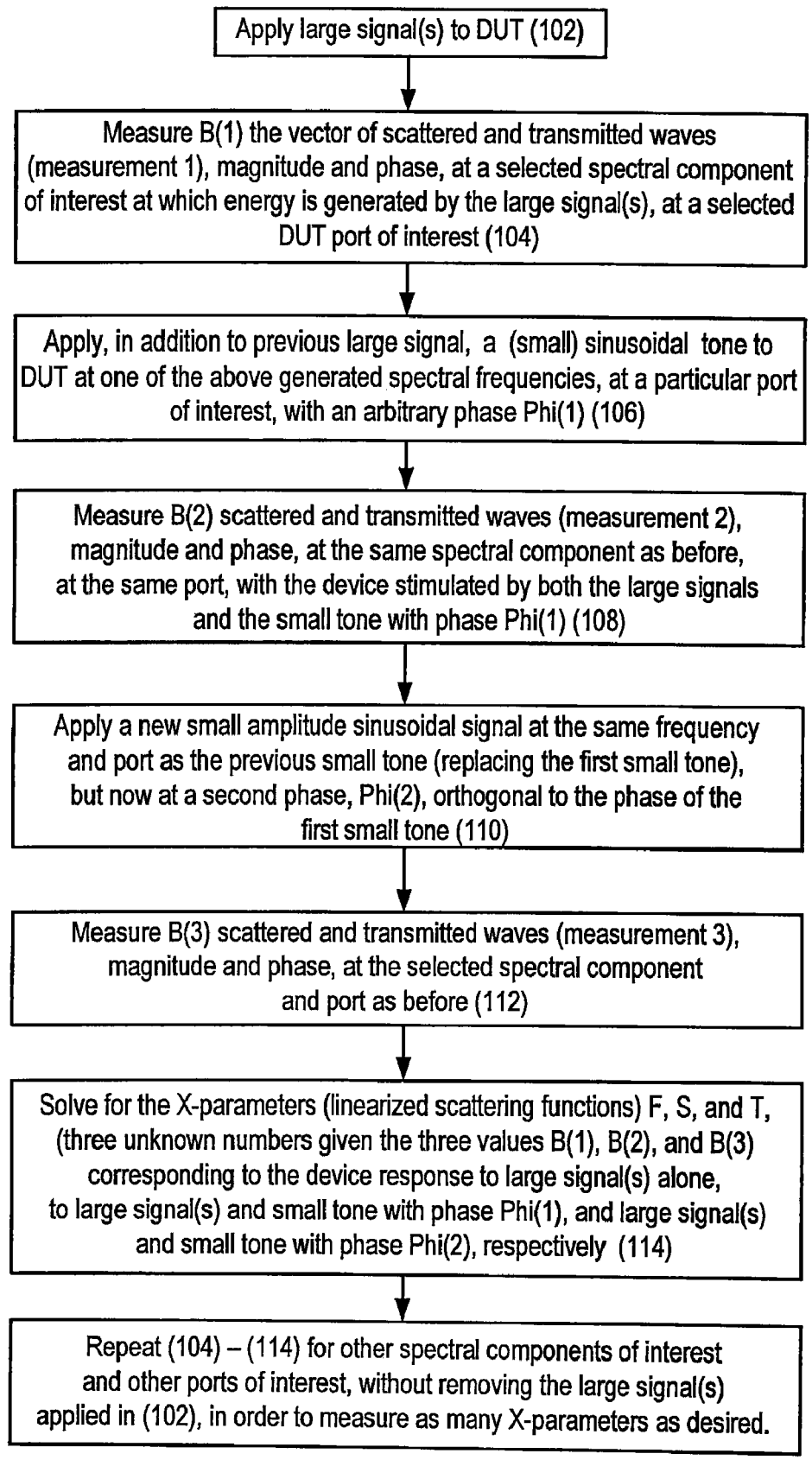
FIG. 2 illustrates a process flowchart according to the invention.

FIG. 2 illustrates a process flowchart according to the invention. In step 102, a first large signal is applied to the device under test. The large signal has a fundamental frequency, amplitude and a first phase. In step 104, a first vector of scattered and transmitted waves for all harmonics at each port of the device under test is measured.

For each device under test port, in step 106, a first small signal is applied to the device under test. The first small signal has a harmonic frequency of the fundamental frequency and phase. In step 108, a second vector of scattered and transmitted waves for all harmonics at each port of the device under test is measured. In step 110, a new signal at a second phase is applied. In step 112, a third vector of scattered and transmitted waves for all harmonics at each port of the device under test is measured. In step 114, linearized scattering functions using the three sets of measurements are extracted.

Figure 3:
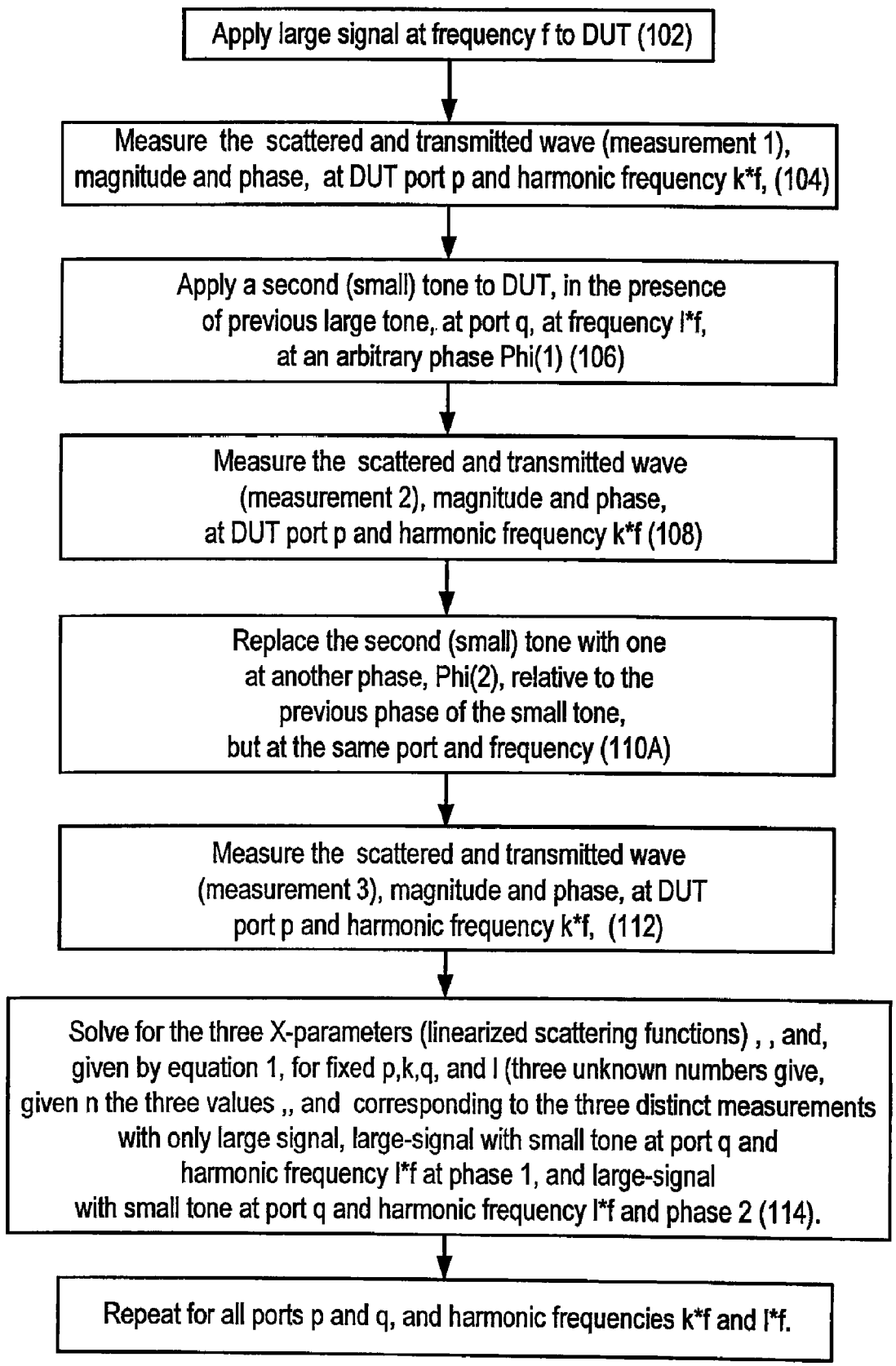
FIG. 3 illustrates a process flowchart for an embodiment of the invention.

FIG. 3 illustrates a process flowchart where the new signal applied is a second small signal. In step 110A, the second small signal has a second phase that is nearly orthogonal to the phase of the first small signal. The measurements may be repeated for all ports p and q, and harmonic indices k and l.

While the illustrative example shows 2 distinct phases, the invention can be extended to N distinct phases, where N is an integer $\geq 3$. The N distinct phases are approximately separated by 360/N degrees.

Figure 4:
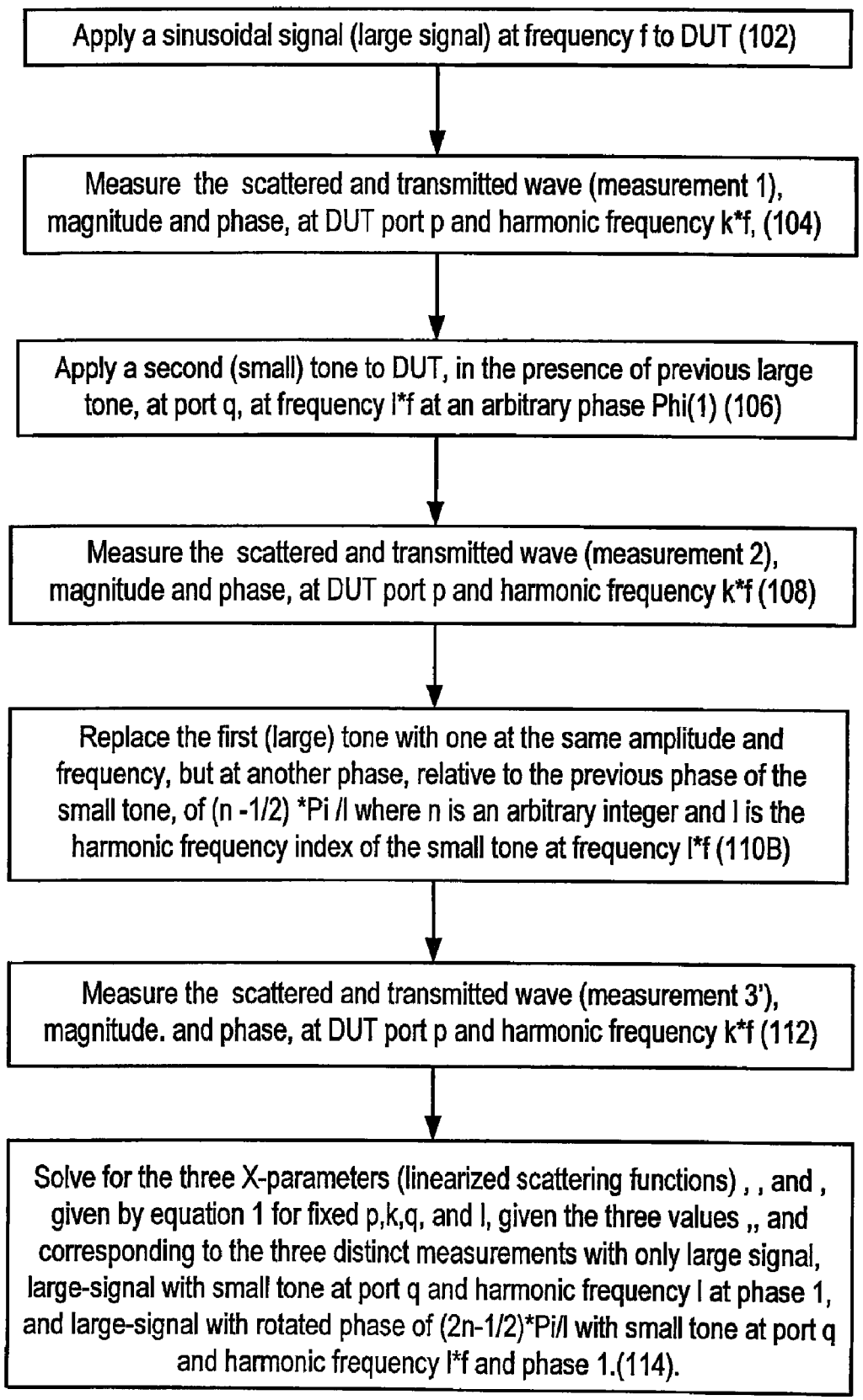
FIG. 4 illustrates a process flowchart for an embodiment of the invention.

In another embodiment, a series of successive measurements are made whereby a combination of phase settings on the large tone and small tones can be set, such that, when the complete response of the system is phase-rotated to the previous experiment, the relative phase of the small tones in the latter is orthogonal to the former. FIG. 4 illustrates a process flowchart accordingly.

FIG. 4 illustrates a process flowchart where the new signal applied is a second large signal. In step 110B, the second large signal has the fundamental frequency and amplitude of the first large signal. The second phase relative to the first phase of the small tone is $(n-\frac{1}{2})*Pi/m$, where n is an integer and m is the harmonic frequency index of the first small signal.

We claim:

1. A method comprising:
    applying a large signal, having one or more fundamental frequencies with associated amplitudes and phases, to a device under test, and
    measuring a first vector of scattered and transmitted waves for all desired harmonics and intermodulation products at each port of the device under test;
    at each port of the device under test and each harmonic or intermodulation frequency of interest, applying separately N small signals at N controlled, distinct phases to the device under test while continuing to apply the large signal, where N is an integer greater than or equal to 2, and measuring a vector of scattered and transmitted waves for all desired harmonics and intermodulation products at each port of the device under test for each small signal;

extracting linearized scattering functions using the N+1 sets of measurements.

2. The method of claim 1, wherein N=2 and the phase of the second small signal is nearly orthogonal to the phase of the first small signal.

3. The method of claim 1, wherein N>=3 and the N small signals have phases separated by approximately 360/N degrees.

4. A method comprising:

applying a first large signal, having one or more fundamental frequencies with associated amplitudes and a first set of phases, to a device under test;

measuring a first vector of scattered and transmitted waves for all desired harmonics and intermodulation products at each port of the device under test;

at each port of the device under test and harmonic or intermodulation frequency of interest, applying a small signal with a fixed phase to the device under test while continuing to apply the first large signal, and measuring a second vector of scattered and transmitted waves for all desired harmonics and intermodulation products at each port of the device under test;

shifting N−1 times, where N is an integer greater than or equal to 2, the phases of the large signal tones such that the phase shifts are equivalent to distinct time translations of the first large signal of between 0 and T, where T is the period of the small signal, and measuring a vector of scattered and transmitted waves for all desired harmonics and intermodulation products at each port of the device under test at each set of large signal phases;

extracting linearized scattering functions using the N+1 sets of measurements.

5. The method of claim 4, wherein N=2 and the phase shifts of the second large signal are nearly equivalent to a time translation of the first large signal of T/4 or 3T/4.

6. The method of claim 4, wherein N>=3 and the phase shifts of the last N−1 large signals are nearly equivalent to time translations of the first large signal between 0 and T separated by approximately T/N.

7. A method for testing a device under test comprising:
for an apparatus including,
a first and a second source;
a signal separation and stimulus control circuit, receiving the first and the second source, connected to the device under test;
a signal conditioning circuit receiving outputs of the signal and separation stimulus control circuit; and
a display receiving an output of the digitization and signal conditioning circuit;
applying a first large signal, having a fundamental frequency, an amplitude, and a first phase, to a device under test;

measuring a first vector of scattered and transmitted waves for all harmonics at each port of the device under test;

at each port of the device under test and each harmonic of interest, while continuing to apply the first large signal, applying separately N small signals at N controlled, distinct phases, to the device under test, where N is an integer greater than or equal to 2, and measuring a vector of scattered and transmitted waves for all desired harmonics and intermodulation products at each port of the device under test for each small signal; and extracting linearized scattering functions using the N+1 sets of measurements.

8. The method of claim 7, wherein N=2 and the phase of the second small signal is nearly orthogonal to the phase of the first small signal.

9. The method of claim 7, wherein N>=3 and the N small signals have phases separated by approximately 360/N degrees.

10. A method for testing a device under test comprising:
for an apparatus including,
a first and a second source;
a signal separation and stimulus control circuit receiving the first and the second source, connected to the device under test;
a signal conditioning circuit receiving outputs of the signal and separation stimulus control; and
a display receiving an output of the digitization and signal conditioning circuit;
applying a first large signal, having a fundamental frequency, an amplitude, and a first phase, to a device under test;

measuring a first vector of scattered and transmitted waves for all harmonics at each port of the device under test;

at each port of the device under test and each harmonic of interest, applying a small signal with a fixed phase to the device under test while continuing to apply the first large signal, and measuring a second vector of scattered and transmitted waves for all desired harmonics and intermodulation products at each port of the device under test;

shifting N−1 times, where N is an integer greater than or equal to 2, the phases of the large signal tones such that the phase shifts are equivalent to distinct time translations of the first large signal of between 0 and T where T is the period of the small signal, and measuring a vector of scattered and transmitted waves for all desired harmonics and intermodulation products at each port of the device under test at each set of large signal phases;

extracting linearized scattering functions using the N+1 sets of measurements.

11. The method of claim 10, wherein N=2 and the phase shifts of the second large signal are nearly equivalent to a time translation of the first large signal of T/4 or 3T/4.

12. The method of claim 10, wherein N>=3 and the phase shifts of the last N−1 large signals are nearly equivalent to time translations of the first large signal between 0 and T separated by approximately T/N.

* * * * *